United States Patent [19]
Yamaguchi et al.

[11] Patent Number: 5,589,668
[45] Date of Patent: Dec. 31, 1996

[54] MULTI-METAL LAYER WIRING TAB TAPE CARRIER AND PROCESS FOR FABRICATING THE SAME

[75] Inventors: Kenji Yamaguchi; Shoji Takagi; Sadahiko Mitsugi; Mamoru Mita; Tomio Murakami, all of Hitachi, Japan

[73] Assignee: Hitachi Cable, Ltd., Tokyo, Japan

[21] Appl. No.: 149,795

[22] Filed: Nov. 10, 1993

[30] Foreign Application Priority Data

May 12, 1993 [JP] Japan ..................... 5-110476

[51] Int. Cl.⁶ ...................................................... H05K 1/14
[52] U.S. Cl. .......................................... 174/266; 174/260
[58] Field of Search ..................... 174/255, 260, 174/261, 262, 266; 361/813, 820; 257/666, 676

[56] References Cited

U.S. PATENT DOCUMENTS

| | | | |
|---|---|---|---|
| 4,437,141 | 3/1984 | Prokop | 361/403 |
| 4,997,517 | 3/1991 | Parthasarathi | 155/630 |
| 5,088,008 | 2/1992 | Takeyama et al. | 361/403 |
| 5,151,771 | 9/1992 | Hiroi et al. | 357/70 |
| 5,262,927 | 11/1993 | Chia et al. | 361/784 |
| 5,264,729 | 11/1993 | Rostoker et al. | 257/774 |
| 5,283,717 | 2/1994 | Hundt | 361/813 |
| 5,285,104 | 2/1994 | Kondo et al. | 23/48 |
| 5,315,486 | 5/1994 | Fillion et al. | 361/795 |

*Primary Examiner*—Laura Thomas
*Attorney, Agent, or Firm*—Antonelli, Terry, Stout & Kraus

[57] ABSTRACT

A multi-metal layer wiring TAB tape carrier capable of forming a fine pattern without affecting the thicknesses of conductive metal layers, and a process for fabricating the multi-metal layer wiring TAB tape carrier. This TAB tape carrier is constructed such that respective dielectric film layers are interposed between adjacent ones of plurality of conductive metal layers having a predetermined wiring pattern, such that the dielectric film layer is formed with interfacial connection holes, and such that a conductive via layer is formed in the interfacial connection holes to electrically connect adjacent conductive metal layers. The conductive via layer is formed by a vapor deposition method such as evaporation, ion plating or sputtering. Alternatively, a portion of the conductive metal layers and the conductive via layer are simultaneously formed. Especially according to the latter method of forming a portion of the conductive metal layers and the conductive via layer simultaneously, the conductive via layer need not be formed after the conductive metal layers so that the fabrication steps are simplified. Moreover, the thicknesses of the conductive metal layers are not adversely affected later, and the conductive metal layers and the conductive via layer can be positioned highly precisely to form a fine wiring pattern.

23 Claims, 3 Drawing Sheets

FIG. 7
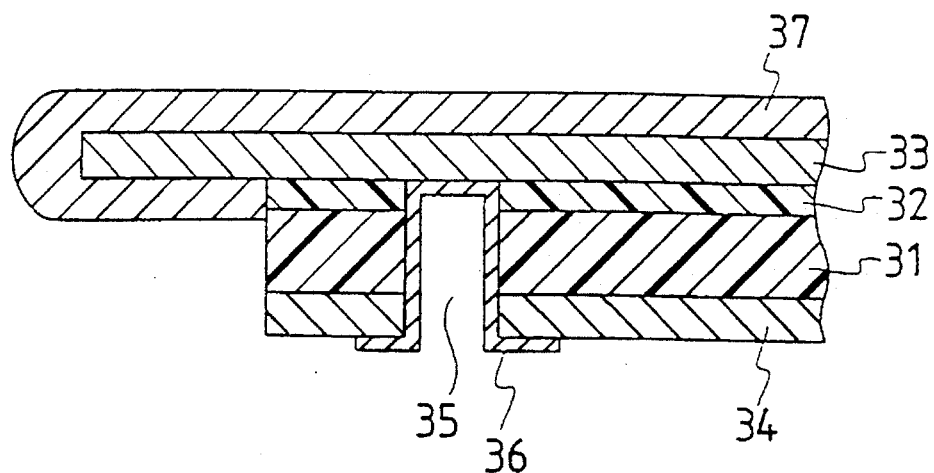
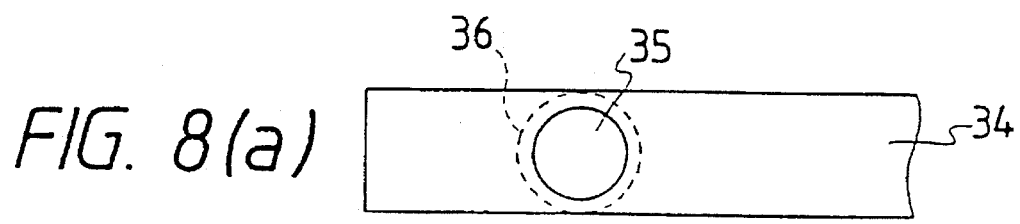
FIG. 8(a)
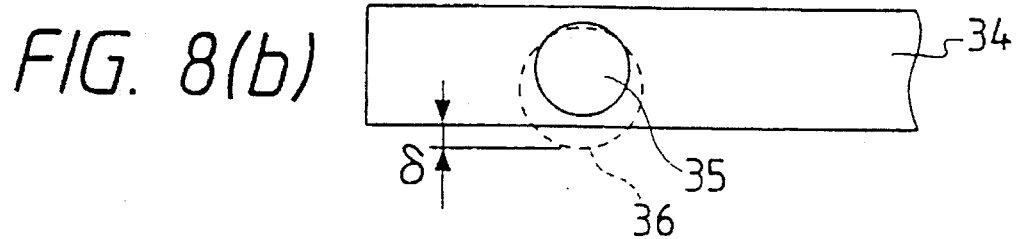
FIG. 8(b)

5,589,668

MULTI-METAL LAYER WIRING TAB TAPE CARRIER AND PROCESS FOR FABRICATING THE SAME

BACKGROUND OF THE INVENTION

The present invention relates to a multi-metal layer wiring TAB (tape automated bonding) tape carrier, in which conductive metal layers arranged on the two surfaces of a dielectric film layer are electrically connected through a conductive via layer formed in interfacial connection holes such as through holes, and a process for fabricating the TAB tape carrier.

In recent years, as a lead frame for a semiconductor device, there has been developed a lead frame of a multimetal to layer structure, which is excellent in transmission characteristics of radio-frequency signals. The lead frame having such multi-metal layer structure employs the multimetal layer wiring TAB tape carrier.

This multi-metal layer wiring TAB tape carrier is known in the prior art, as disclosed in U.S. Pat. No. 4,997,517. According to this disclosure, an dielectric film layer is interposed between a plurality of conductive metal layers having a predetermined wiring pattern to insulate the conductive metal layers electrically, and the dielectric film layer is formed with interfacial connection holes, in which is formed by an electrolytic plating method a conductive via layer for electrically connecting the surface and back conductive metal layers through the dielectric film layer.

Such multi-metal layer wiring TAB tape carrier is constructed, as shown in FIGS. 7 and 8, by forming a (not-shown) device hole corresponding to an IC element in a dielectric film layer 31 made of a resin such as organic polyimide or glass epoxy, and by forming a surface conductive metal layer 33 on the surface of the dielectric film layer 31 via an adhesive layer 32 and a back conductive metal layer 34 on the back of the dielectric film layer 31. The surface conductive metal layer 33 is formed with a wiring pattern, which is connected with the IC element. On the other hand, the back conductive metal layer 34 of the multi-metal layer wiring TAB tape carrier is either connected with a power supply or grounded to the earth. Moreover, the dielectric film layer 31 is formed with interfacial connection holes such as via holes 35 extending to the surface and back, and a conductive via layer 36 is formed on the inner walls of the via holes 35 by the panel or pattern plating method to connect the surface conductive metal layer 33 and the back conductive metal layer 34 electrically.

In the aforementioned multi-metal layer wiring TAB tape carrier of the prior art, however, if the conductive via layer 36 on the inner walls of the via holes is formed by the panel plating method, a plated layer 37 having a larger thickness than the conductive via layer 36 is also formed over the surface conductive metal layer 33, as shown in FIG. 7, simultaneously with the formation of the conductive via layer 36. Thus, there arises a problem that it is difficult to form the wiring pattern of a photoresist later on the surface conductive metal layer. Especially, the aforementioned plated layer 37 is troubled in that it is thickened at the surface conductive metal layer and around the inner leads, to raise another problem that it is difficult to wire the surface conductive metal layer and the inner leads finely by the etching method. With the copper layer thus having its thickness increased or locally fluctuated, moreover, a trouble of short-circuiting may be caused by the unetched portion (i.e., the remaining copper layer). Generally speaking, the conductive via layer is required to have a thickness of 3 to 7 μm, whereas the surface conductive metal layer and the portions around the inner leads are required to have a plated thickness of 10 to 20 μm, i.e., three times as large as that of the thickness of the conductive via layer due to the concentration or the like of the plating current because the plating liquid is well stirred. For the fine wiring, it is essential to reduce the pitch and width of the wiring pattern of the surface conductive metal layer. Since these pitch and width of the pattern usually have their minimums regulated by the thickness of the surface conductive metal layer, the increase in the thickness of the surface conductive metal layer is a seriously undesired phenomenon.

In the aforementioned multi-metal layer wiring TAB tape carrier of the prior art, on the other hand, if the conductive via layer 36 of the via holes 35 is formed by the pattern plating method after the surface conductive metal layer 33 is formed with the wiring pattern, a discrepancy 6 is established, as shown at (b) in FIG. 8, between the wiring pattern and the pattern formed by the photoresist, due to the limitation to the registration accuracy of the photoresist in case the wiring pattern has a small width (e.g.., no more than 200 μm). This raises a problem that fine patterns are difficult to form. Incidentally, the case, in which the conductive metal layer 36 is formed in its normal position, is shown at (a) in FIG. 8.

Moreover, the aforementioned pattern plating method has to resort to an electric plating method, and is indispensible for electrode wiring. Thus, the wiring design is limited to raise a problem that it becomes difficult to provide fine wiring.

SUMMARY OF THE INVENTION

An object of the present invention is to provide a multimetal layer wiring TAB tape carrier capable of forming a fine pattern without affecting the thicknesses of conductive metal layers, and a process for fabricating the multi-metal layer wiring TAB tape carrier.

According to an aspect of the present invention, this TAB tape carrier is constructed such that a dielectric film layer is formed between a plurality of conductive metal layers having a predetermined wiring pattern, such that the dielectric film layer is formed with interfacial connection holes, and such that a conductive via layer is formed in the interfacial connection holes to connect the, surface and back conductive metal layers electrically. The conductive via layer is formed by a plating method.

According to another aspect of the present invention, at least one of the conductive metal layers and the conductive via layer are formed as a codeposited common layer by the vapor deposition method.

The multi-metal layer wiring TAB tape carrier of the present invention has its conductive via layer formed by a vapor deposition method such as evaporation, ion plating or a sputtering method. Alternatively, a portion of the conductive metal layers and the conductive via layer are simultaneously formed, so as to form a continuous, integral layer of the portion of the conductive metal layers and the conductive via layer. Especially according to the latter method of forming a portion of the conductive metal layers and the conductive via layer simultaneously, the conductive via layer need not be formed after the conductive metal layers so that the fabrication steps are simplified. Moreover, the thickness of the conductive metal layers are not adversely affected later, and the conductive metal layers and the conductive via layer can be positioned highly precisely to form a fine wiring pattern.

Incidentally, formation of the conductive via layer by a vapor deposition method according to the present invention can also be applied to the interfacial connection holes such as either through holes or via holes.

Incidentally, our experiments and investigation have revealed that when using the aforementioned vapor deposition method (e.g., evaporation) as the method of forming the conductive via layer the purity of the material copper has a serious effect on the pattern defects (e.g., partial deficiency or cut-off of the pattern), in a case where a copper conductive via layer is to be formed. Specifically, when copper having a purity of 3N grade (i.e., 99.9%) is used as the material, fine particles of copper oxide are contained in the evaporated film to increase the pattern deficiency.

In the ordinary evaporation method, for example, the conductive via layer formed has a thickness of about 0.5 to 3 μm. However, the crystal particle size of copper is usually about 0.5 to 1.0 μm, so that the conductive via layer can be deemed to be constructed of one crystal in respect of its thickness. As a result, in case the crystal is oxidized, or in case fine copper oxide particles or metal oxide (e.g., ceramics of silicon oxide or aluminum oxide) are present in the crystal, there arises a problem that the wiring pattern is formed with a saw-tooth shaped side having roughness. Against this problem, it has been found that an impurity such as a oxide present in the conductive metal layer or the conductive via layer can be drastically reduced by using highly pure copper having a purity of 99.9999 weight percent or higher as the material, to prevent the disadvantage such as pattern disconnection caused by the impurity.

BRIEF DESCRIPTION OF THE DRAWINGS

FIG. 7 is an enlarged section showing a portion of the multi-metal layer wiring TAB tape carrier of the prior art; and FIGS. 8(a) and 8(b) are enlarged top plan views showing portions of another multi-metal layer wiring TAB tape carrier of the prior art.

DESCRIPTION OF THE PREFERRED EMBODIMENTS

One embodiment of a two-metal layer wiring TAB tape carrier according to the present invention will be described in the following with reference to the accompanying drawings.

Figure 1:
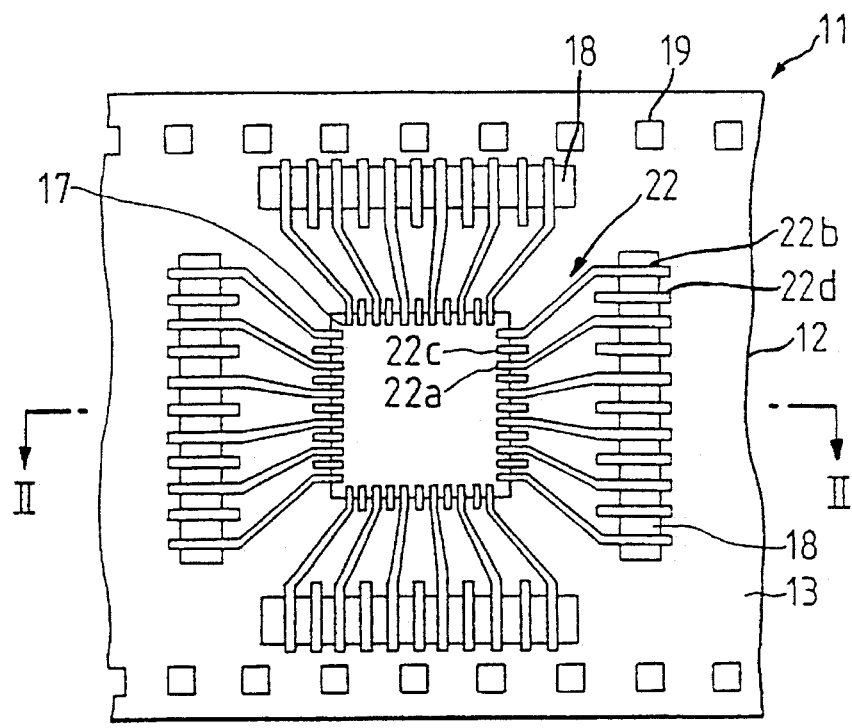
FIG. 1 is a top plan view showing a multi-metal layer wiring TAB tape carrier according to one embodiment of the present invention.
Figure 2:
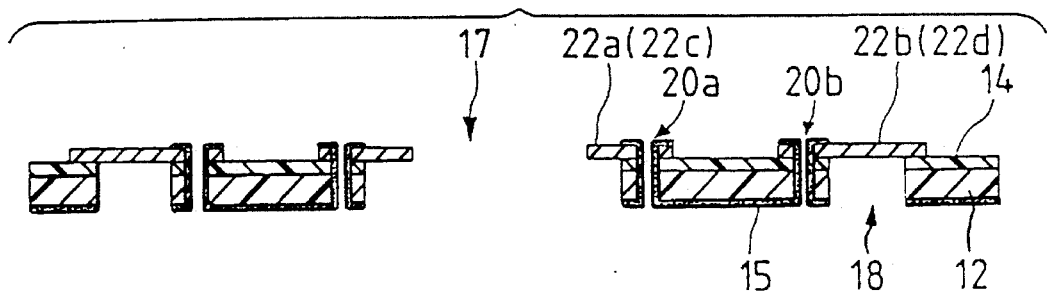
FIG. 2 is a section taken along line II—II of FIG. 1 and showing the multi-metal layer wiring TAB tape carrier.
Figure 3:
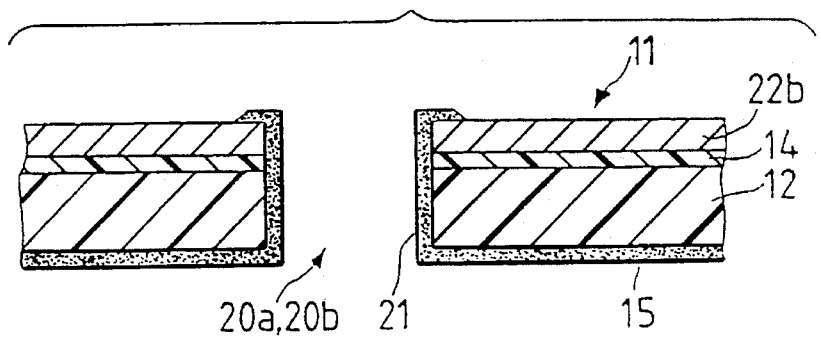
FIG. 3 is an enlarged section showing a through hole portion of the multi-metal layer wiring TAB tape carrier of FIG. 1.
Figure 4:
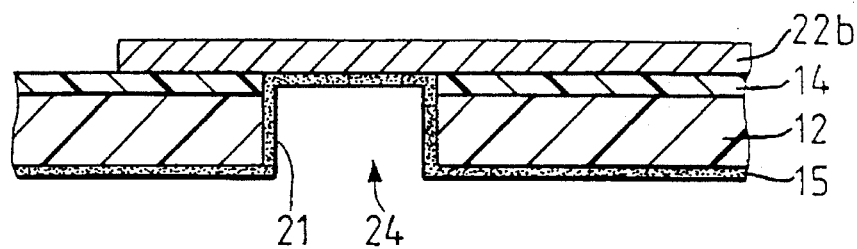
FIG. 4 is an enlarged section showing a via hole portion of the multi-metal layer wiring TAB tape carrier of FIG. 1.

In FIGS. 1 to 5, reference numeral 11 designates a dual-metal layer wiring TAB tape carrier. This dual-metal layer wiring TAB tape carrier 11 is composed to include: a dielectric film layer 12 made of a polyimide film or a glass epoxy film; a surface conductive metal layer 13 formed on the surface of the dielectric film layer 12; an adhesive layer 14 adhering the surface conductive metal layer 13 to the dielectric film layer 12; and a back conductive metal layer 15 formed on the back of the dielectric film layer 12. This dielectric film layer 12 is made of UPILEX S (i.e., Trade Name; manufactured by Ube Industries, Ltd., of Japan) having a thickness of about 125 μm. The surface conductive metal layer 13 is formed by adhering an electrolytic refined copper foil, having a lead pattern 22 by photo-etching or the like. This lead pattern 22 is formed of inner lead portions 22a and 22c around a device hole 17 and outer lead portions 22b and 22d around OLB (i.e., Outer Lead Bonding) holes 18, as will be detailed hereinafter. As shown in FIG. 3, the back conductive metal layer 15 is formed integrally and simultaneously with a conductive via layer 21 by vapor deposition.

Figure 5:
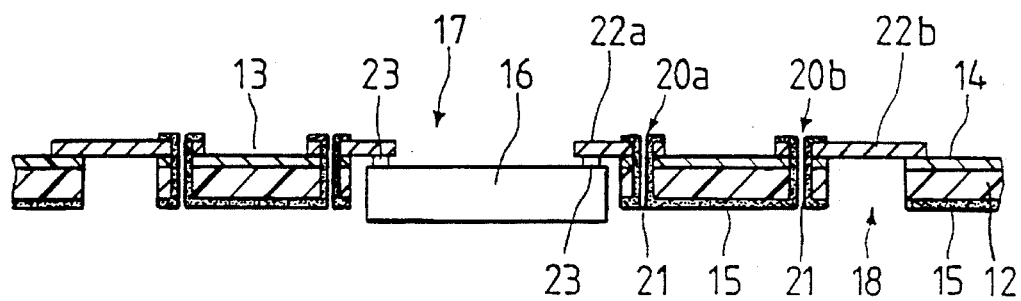
FIG. 5 is a section showing the state in which an IC element is packaged in the multi-metal layer wiring TAB tape carrier of FIG. 1.

The dual-metal layer wiring TAB tape carrier 11 is formed with: the device hole 17 having a square shape and located at the center of the lead pattern 22; the four OLB holes 18 located outside of the individual sides of the device hole 17; and pilot perforations 19 arranged at the two sides of the tape carrier 11 for driving the tape carrier 11. As shown in FIG. 5, the device hole 17 is provided therein with an IC element (semiconductor chip) 16, which is connected with the inner lead portions 22a of the lead pattern 22 by means of bumps 23.

The dual-metal layer wiring TAB tape carrier 11 is further formed with through holes 20a and 20b extending through the dielectric film layer 12, and these through holes 20a and 20b have their wall faces formed with the conductive via layer 21. The through hole 20a is so opened in the vicinity of the device hole 17 as to correspond to the power supply or grounding inner lead portion 22a, and the through hole 20b is so opened inside of the OLB holes 18 as to correspond to the outer lead portion 22b. The conductive via layer 21 of the through hole 20a connects the inner lead portion 22a with the back conductive metal layer 15 whereas the conductive via layer 21 of the through hole 20b connects the outer lead portion 22b with the back conductive metal layer 15.

The dual-metal layer wiring TAB tape carrier of this embodiment is fabricated in the following manner. First of all, the adhesive layer 14 is formed by applying a polyimide adhesive having a thickness of about 18 μm to the surface of the dielectric film layer 12 having a thickness of about 125 μm. Then, the device hole 17 and the through holes 20a and 20b and so on are formed by punching. After this, the lead pattern 22 is formed by photochemical etching of conductive metal layer 13 having a thickness of about 18 μm laminated at a temperature of 210° C., by using a hot roll laminator.

Next, a mask is attached on the surface conductive metal layer 13, and the remaining portion is surfaced with nickel to a thickness of about 500 angstroms by vacuum evaporation. Nickel has a superior bondability to copper and the polyimide. After this, a copper layer is formed by vacuum evaporation using a highly pure OFC (i.e., Oxygen Free Copper) having a purity of 99.9999% by weight or higher. Incidentally, the highly pure OFC used as the material is prepared by purifying low grade OFC of 99.9999% by electric refining and by zone melting. As a result of this vacuum evaporation, the back conductive metal layer 15 is formed on the back of the dielectric film layer 12, and the conductive via layer 21 is formed all over the inner wall faces of the through holes 20a and 20b. As clearly seen from FIG. 3, the dielectric film layer 12 has its surface side end portions overlapped together with the back conductive metal layer 15 on the surface conductive metal layer 13 to connect the conductive metal layers 13 and 15 electrically.

Subsequently, the back conductive metal layer 15 is formed with the power supply and grounding wiring pattern and has its whole surface treated with solder to a thickness of about 4 μm. After this, the IC element 16 is packaged by arranging the IC element 16 in the device hole 17 and by connecting it with the lead pattern 22. The back conductive metal layer 15 is used for the power supply or grounding operation but need not be finely wired usually but is used as a better pattern. Therefore, the back conductive metal layer 15 is prepared by vapor deposition need not always be formed with any pattern by etching. In the vapor deposition, therefore, the remaining portion can be subjected all over its surface to the evaporation while the OLB holes 18 and the device hole 17 being shielded therein with an evaporation mask (incidentally, the device hole and the OLB holes have to be shielded with at least the evaporation mask because the pattern is short-circuited if the dielectric film layer in the device hole has its side faces or the like subject to the evaporation). There may be a case in which the back conductive metal layer is formed of not the better pattern but several simple wiring patterns. If, in this case, the back conductive metal layer is to be formed by evaporation, the wiring pattern is so simple that it can be easily formed by using the evaporation mask.

In the TAB tape carrier of this embodiment, the back conductive metal layer 15 and the conductive via layer 21 are formed of the highly pure copper having a purity of 99.9999 weight percent or higher, so that an impurity, such as oxides, to be contained in those layers 15 and 21, can be remarkably reduced. As a result, even if the wiring pattern is thinned, no saw-tooth roughness is formed on its side, nor is there a disadvantage such as the cutting or cracking of the pattern, so that high reliability and durability can be achieved. In addition, electric resistance of the wiring pattern is reduced, so that an improvement in electric characteristics can be achieved.

Incidentally, the present invention can be applied to not only the through holes 20a and 20b extending through the dielectric film layer 12 or the like, but also the via hole which has its one end closed by the surface conductive metal layer 13. Moreover, the structure formed with the via hole 24 (see FIG. 4) is formed with the conductive via layer 21, which integrally extends as far as the back of the surface conductive metal layer 13, by the aforementioned vacuum evaporation, so that the electric connection is maintained by the conductive via layer 21.

As to the semiconductor device thus constructed, an inductance L was calculated from the following Equation (1) while considering the length of the bonding wires and the length of the wiring leads. From the following Equation (2), the level of noise Vn was also calculated when the I/O of the semiconductor device was simultaneously switched. The inductance L and the noise level Vn thus calculated were compared with those of the prior art. Then, it was found that the inductance L was reduced to two-thirds and that the noise level was also reduced to about two-thirds.

$$L = (\mu r \cdot \epsilon r)^{1/2} Z_0/C_o \quad (1)$$
$$= 2 \cdot \ln\{6H/(0.8W + T)\}(nH/cm),$$

wherein:

μr·εr: Specific Permeability (=1) Specific Inductivity;
Co: Velocity of Light (=3×10⁸ m/s);
Zo: Characteristic Impedance of Wiring Path;
H: Length of Dielectric Layer;
W: Width of Wiring Layer; and
T: Length of Wiring Layer.

$$Vn = Ls(di/dt) \quad (2),$$

wherein:

Ls: Self-Inductance of Power Source Line;
i: Current (ΣΔi) Having Flown through Power Source Line;
Δi: In-flow current per Output circuit; and
t: Signal Switching Time.

Figure 6:
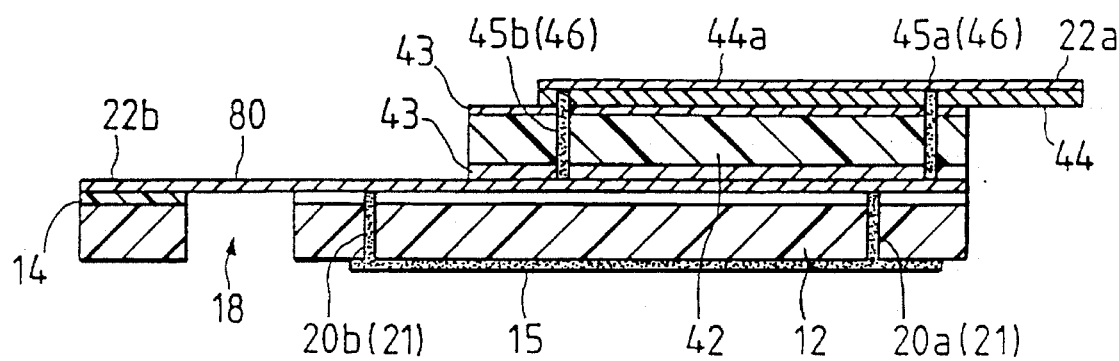
FIG. 6 is a longitudinal section showing a multi-metal layer wiring TAB tape carrier according to another embodiment of the present invention.

Next, FIG. 6 shows a multi-metal layer wiring TAB tape carrier according to another, 4-metal, embodiment of the present invention. Incidentally, the portions common to those of the foregoing embodiment will be designated at identical reference numerals, and their description will be simplified and omitted.

In this embodiment, an intermediate conductive metal layer is formed by forming the adhesive layer 14 of a polyimide adhesive on the surface of the first dielectric film layer 12 made of a polyimide film and by adhering an OFC rolled foil having a thickness of 35 μm. The intermediate conductive metal layer 80 thus formed is subjected to a pattern etching or the like to form the outer lead portions 22b.

Subsequently, a surface layer of nickel is formed to a thickness of about 500 angstroms by an ion plating method, and thereafter vacuum evaporation is carried out to form a copper layer having a thickness of about 4 μm. As a result of the treatment of this ion plating method, the conductive via layer 21 of the through holes 20a and 20b and the back conductive metal layer 15 are simultaneously formed. Then, the back conductive metal layer 15 is subjected to the pattern etching to form the grounding portions or the like.

Next, a polyimide adhesive is applied to the two surfaces of a second dielectric film layer 42 having a thickness of 75 μm to form adhesive layers 43, and an electrolytic refined copper foil having a thickness of 8 μm is applied through the adhesive layer 43 to one surface of the second dielectric film layer 42 to form a surface conductive metal layer 44. Then the second dielectric film layer 42 is punched to form through holes 45a and 45b. After this, the other surface of the second dielectric film layer 42 is applied to the back of the aforementioned first dielectric film layer 12 and is adhered thereto by the adhesive layer 43.

After this, a nickel surface layer of a thickness of about 200 angstroms is applied to the conductive metal layer 44 and the through holes 45a and 45b of the second dielectric film layer 42. Vacuum evaporation is then carried out to form a copper layer having a thickness of 4 μm, thereby to form a conductive via layer 46 on the inner faces of the through holes 45a and 45b and the conductive via layer 44a on the conductive metal layer 44 of the second dielectric film layer 42. Then, the inner lead portion 22a is formed by the pattern etching, and the whole surface is then treated with solder having a thickness of 4 μm. Thus, the multi-metal layer wiring TAB tape carrier is completed.

Incidentally, in the embodiment described above, the dielectric film layer is exemplified by a polyimide film called "UPILEX S" (i.e., Trade Name) but can be exemplified by another film called "KAPTON V" or "KAPTON SUPER V" (both being known under Trade Name, manufactured by DuPont), and the dielectric film can also be exemplified by a two-layered CCL (i.e., Copper-Clad Laminate) which is prepared by applying polyimide varnish to a copper foil. In this case, the copper foil of the two-layered CCL is used as the back conductive metal layer. Thanks to this formation, the component is already formed with the copper foil on its one surface so that it becomes unnecessary to form the back conductive metal layer. As a result, it is sufficient to form the through holes only in the conductive via layer in the vapor deposition.

In the aforementioned embodiment, moreover, a nickel surface layer having a thickness of 200 to 500 angstroms is formed for the surface treatment with vapor deposition. The material for the surface layer should not be limited to nickel, but can be exemplified by titanium or chromium having an arbitrary thickness ranging from 30–1000 angstroms.

Moreover, vapor deposition is exemplified by evaporation or ion plating method, but the present invention can naturally be achieved by another vapor deposition such as the sputtering method.

As has been described hereinbefore, according to the process for fabricating the multi-metal layer wiring TAB tape carrier of the present invention, the conductive via layer in the interfacial connection holes for connecting the individual conductive metal layers is formed by a vapor deposition method. Alternatively, the conductive metal layers are partially formed by the vapor deposition simultaneously as the conductive via layer of the interfacial connection holes is formed by the vapor deposition method. As a result, the conductive via layer can be easily formed without changing the thickness of the conductive metal layers so that the wiring pattern can be precisely formed. Another effect is that a fine wiring pattern can be achieved to give a high degree of freedom to the wiring design.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A multi-metal layer wiring TAB tape carrier, comprising:

a plurality of conductive metal layers forming a wiring pattern of said TAB tape carrier;

at least one dielectric layer interposed between said conductive metal layers for electrically isolating said conductive metal layers from each other, a first conductive metal layer, of the plurality of conductive metal layers, being on a first side of said at least one dielectric layer, and a second conductive metal layer, of the plurality of conductive metal layers, being on an opposed side of the at least one dielectric layer, said at least one dielectric layer having connection holes therethrough; and a conductive via layer formed in said connection holes, so as to electrically connect said first conductive metal layer to said second conductive metal layer through said at least one dielectric layer, by way of said conductive via layer, wherein said conductive via layer and one of the first and second conductive metal layers are codeposited layers formed by vapor deposition, and wherein said conductive via layer and said one of the first and second conductive metal layers are a continuous integral layer.

2. A multi-metal layer wiring TAB tape carrier according to claim 1, wherein the first conductive layer forms a back surface of the tape carrier.

3. A multi-metal layer wiring TAB tape carrier according to claim 1, wherein the connection holes extend so as to expose a back face of the first conductive metal layer, said back face being adjacent the dielectric layer having the connection holes therethrough, the conductive via layer contacting said back face.

4. A multi-metal layer wiring TAB tape carrier according to claim 3, wherein the conductive via layer covers said back face.

5. A multi-metal layer wiring TAB tape carrier according to claim 1, wherein one of the first and second conductive metal layers has holes therethrough corresponding to said connection holes, and the conductive via layer extends through the holes in said one of the first and second conductive metal layers corresponding to said connection holes.

6. A multi-metal layer wiring TAB tape carrier according to claim 1, wherein the conductive via layer is made of copper, of a purity of at least 99.9999 weight percent.

7. A multi-metal layer wiring TAB tape carrier according to claim 1, wherein the wiring pattern is a lead pattern of the TAB tape carrier.

8. A multi-metal layer wiring TAB tape carrier according to claim 7, further comprising a semiconductor chip positioned on the TAB tape carrier, at a central position of the lead pattern.

9. A multi-metal layer wiring TAB tape carrier, comprising:

a plurality of conductive metal layers forming a wiring pattern of said TAB tape carrier;

at least one dielectric layer interposed between said conductive metal layers, for electrically isolating said conductive metal layers from each other, said at least one dielectric layer having connection holes therethrough; and a conductive via layer formed in said connection holes so as to electrically connect said conductive metal layers through said dielectric layer, by way of said conductive via layer, wherein at least one of said conductive metal layers and said conductive via layer are an integral layer, said integral layer being a layer formed by vapor deposition, and wherein said conductive via layer and said at least one of said conductive metal layers are a continuous integral layer.

10. A multi-metal layer wiring TAB tape carrier according to claim 9, wherein said at least one of said conductive metal layers and said conductive via layer are integral continuous layers, being layers formed simultaneously by vapor deposition.

11. A multi-metal layer wiring TAB tape carrier according to claim 9, wherein at least one of said conductive metal layers, and the conductive via layer are made of copper, of a purity of at least 99.9999 weight percent.

12. A multi-metal layer wiring TAB tape carrier according to claim 9, wherein said at least one of said conductive metal layers forms a back surface of the TAB tape carrier.

13. A multi-metal layer wiring TAB tape carrier according to claim 9, wherein the wiring pattern is a lead pattern of the TAB tape carrier.

14. A multi-metal layer wiring TAB tape carrier according to claim 13, further comprising a semiconductor chip positioned on the TAB tape carrier, at a central position of the lead pattern.

15. A multi-metal layer wiring TAB tape carrier, comprising:

a plurality of conductive metal layers having a wiring pattern;

at least two dielectric layers interposed between said conductive metal layers for electrically isolating said conductive metal layers from each other, said at least two dielectric layers being formed with connection holes; and a conductive via layer formed in said connection holes, so as to electrically connect said conductive metal layers through said dielectric layer, by way of said conductive via layer, wherein a first dielectric layer, of said at least two dielectric layers, is made of a polyimide film, wherein an intermediate one of said conductive metal layers is formed by adhering an oxygen free copper foil to a surface of said first dielectric layer, through an adhesive layer made of a polyimide adhesive, wherein a first conductive via layer is provided in first through-holes of said first dielectric layer, and said first conductive via layer and a back one of said conductive metal layers are an integral layer, said integral layer being a layer formed by vapor deposition, wherein a second dielectric layer, of said at least two dielectric layers, has its two opposed surfaces formed with adhesive layers made of a polyimide adhesive, wherein said second dielectric layer has second through-holes and has a back surface thereof adhered to a surface of said intermediate one of said conductive metal layers, and wherein a second conductive via layer of copper is provided on inner sides of said second through-holes and on a conductive metal layer on a surface of said second dielectric layer furthest from the intermediate one of said conductive metal layers, said second conductive via layer being a layer formed by vacuum evaporation.

16. Product formed by a process for fabricating a multilayer wiring TAB tape carrier, the process comprising the steps of:

providing a plurality of conductive metal layers having a wiring pattern;

interposing at least one dielectric layer between said conductive metal layers, for electrically isolating said conductive metal layers, said at least one dielectric layer having connection holes; and forming a conductive via layer in said connection holes, so as to connect electrically said conductive metal layers through said dielectric layer, by way of said conductive via layer, wherein said conductive via layer and one of the plurality of conductive metal layers are codeposited layers formed by vapor deposition, and wherein said conductive via layer and said one of the plurality of conductive metal layers are a continuous integral layer.

17. Product formed by a process for fabricating a multi-metal layer wiring TAB tape carrier, the process comprising the steps of:

providing a plurality of conductive metal layers having a wiring pattern;

interposing at least one dielectric layer between said conductive metal layers, for electrically isolating said conductive metal layers from each other, said at least one dielectric layer being formed with connection holes; and forming a conductive via layer in said connection holes, so as to connect electrically said conductive metal layers through said at least one dielectric film layer, by way of said conductive via layer, wherein at least one of said conductive metal layers and said conductive via layer are layers simultaneously formed, by vapor deposition, and wherein said conductive via layer and said at least one of said conductive metal layers are a continuous integral layer.

18. The product according to claim 17, wherein the at least one of the conductive metal layers and the conductive via layer, which are layers simultaneously formed by vapor deposition, are made of copper of a purity of at least 99.9999 weight percent.

19. Product formed by a process for fabricating a multi-metal layer wiring TAB tape carrier, the process comprising the steps of:

providing a plurality of conductive metal layers having a wiring pattern;

interposing at least one dielectric layer between said conductive metal layers, for electrically isolating said conductive metal layers, said at least one dielectric layer being formed with connection holes; and forming a conductive via layer in said connection holes, for electrically connecting said conductive metal layers through said dielectric film layer, by way of said conductive via layer, wherein said at least one dielectric layer includes a first dielectric layer made of a polyimide film, and an oxygen free copper foil is adhered to a first surface of said first dielectric layer through an adhesive layer made of a polyimide adhesive, to form an intermediate one of said conductive metal layers, wherein a conductive via layer in first through-holes of said first dielectric layer, and a back conductive metal layer of said conductive metal layers, are formed as a codeposited common layer by vapor deposition in forming the conductive via layer, the back conductive metal layer being provided on a surface of the first dielectric layer opposite the first surface of the first dielectric, wherein said at least one dielectric layer includes a second dielectric layer having two opposed surfaces formed with adhesive layers of a polyimide adhesive, and an electrically refined copper foil is adhered to a first surface of said second dielectric layer, to form a surface conductive metal layer, wherein said second dielectric layer is formed with second through-holes and has a back thereof, opposite to the first surface of said second dielectric layer, adhered to said first dielectric layer, and wherein a codeposited common conductive via layer made of copper is formed on inner faces of said second through-holes and on the conductive metal layer adhered to the first surface of said second dielectric film layer, by vacuum evaporation.

20. The product according to claim 19, wherein each of the codeposited common layer and the codeposited common conductive via layer is of copper having a purity of at least 99.9999 weight percent.

21. Product formed by a process for fabricating a multi-metal layer wiring TAB tape carrier, the process comprising the steps of:

providing a plurality of conductive metal layers having a wiring pattern;

interposing at least one dielectric layer between said conductive metal layers for electrically isolating said conductive metal layers from each other, said dielectric layer being formed with connection holes; and forming a conductive via layer in said connection holes, so as to electrically connect said conductive metal layers through said dielectric film layer, by way of said conductive via layer, wherein said at least one dielectric layer and plurality of conductive metal layers include a two-layered copper-clad laminate formed by applying polyimide varnish to a copper foil so that the copper foil is a back conductive metal layer of said conductive metal layers, and wherein the conductive via layer formed in said connection holes is a layer formed by vapor deposition.

22. The product according to claim 21, wherein the conductive via layer is made of copper having a purity of at least 99.9999 weight percent.

23. A multi-metal layer wiring TAB tape carrier, comprising:

a plurality of conductive metal layers forming a wiring pattern of said TAB tape carrier;

at least one dielectric layer interposed between said conductive metal layers for electrically isolating said conductive metal layers from each other, a first conductive metal layer, of the plurality of conductive metal layers, being on a first side of said at least one dielectric layer, and a second conductive metal layer, of the plurality of conductive metal layers, being on an opposed side of the at least one dielectric layer, said at least one dielectric layer having connection holes therethrough; and a conductive via layer formed in said connection holes, so as to electrically connect said first conductive metal layer to said second conductive metal layer through said at least one dielectric layer, by way of said conductive via layer, wherein said conductive via layer and one of the first and second conductive metal layers are codeposited layers formed by vapor deposition, wherein one of the first and second conductive metal layers has holes therethrough corresponding to said connection holes, and the conductive via layer extends through the holes in said one of the first and second conductive metal layers corresponding to said connection holes, and wherein said one of the first and second conductive metal layers has a front face furthest from the at least one dielectric layer, and wherein said conductive via layer overlaps said front face of said one of the first and second conductive metal layers.

\* \* \* \* \*